(12) United States Patent
Srinivasamurthy et al.

(10) Patent No.: US 10,309,996 B2
(45) Date of Patent: Jun. 4, 2019

(54) METHOD FOR DETERMINING THE PHASE CURRENTS OF AN ELECTRIC MACHINE HAVING A CONVERTER

(71) Applicant: Robert Bosch GmbH, Stuttgart (DE)

(72) Inventors: Arunkumar Motaganahalli Srinivasamurthy, Stuttgart (DE); Julian Roesner, Untergruppenbach (DE)

(73) Assignees: Robert Bosch GmbH, Stuttgart (DE); SEG Automotive Germany GmbH, Stuttgart (DE)

( * ) Notice: Subject to any disclaimer, the term of this patent is extended or adjusted under 35 U.S.C. 154(b) by 11 days.

(21) Appl. No.: 15/322,971

(22) PCT Filed: Jun. 9, 2015

(86) PCT No.: PCT/EP2015/062787
§ 371 (c)(1),
(2) Date: Dec. 29, 2016

(87) PCT Pub. No.: WO2016/000916
PCT Pub. Date: Jan. 7, 2016

(65) Prior Publication Data
US 2017/0138993 A1    May 18, 2017

(30) Foreign Application Priority Data
Jul. 4, 2014   (DE) ........................ 10 2014 213 077

(51) Int. Cl.
*G01R 25/00*    (2006.01)
*G01R 31/34*    (2006.01)
(Continued)

(52) U.S. Cl.
CPC ................ *G01R 25/00* (2013.01); *B60L 7/18* (2013.01); *G01R 31/006* (2013.01); *G01R 31/34* (2013.01);
(Continued)

(58) Field of Classification Search
CPC ...... G01R 25/00; G01R 31/34; G01R 31/006; H02P 23/14; H02P 25/22; B60L 7/18
See application file for complete search history.

(56) References Cited

U.S. PATENT DOCUMENTS

2003/0234626 A1* 12/2003 Gallegos-Lopez ..... H02P 27/08
318/432
2004/0080296 A1*  4/2004 Mir ....................... H02P 25/092
318/701

(Continued)

FOREIGN PATENT DOCUMENTS

DE          10327690 B4   1/2012
DE        102011003897 A1  8/2012
(Continued)

OTHER PUBLICATIONS

International Search Report dated Sep. 10, 2015, of the corresponding International Application PCT/EP2015/062787 filed Jun. 9, 2015.

*Primary Examiner* — Son T Le
*Assistant Examiner* — Akm Zakaria
(74) *Attorney, Agent, or Firm* — Norton Rose Fulbright US LLP; Gerard A. Messina

(57) ABSTRACT

A method for determining the phase currents of an electric machine having a power converter, and a stator, the power converter having, for each phase, an upper branch having an upper switch and a lower branch having a lower switch, all the upper branches being connected to an upper DC voltage terminal and all the lower branches to a lower DC voltage terminal. The power converter is operated in an active (Continued)

rectification mode in which each upper switch is closed only as long as a phase voltage at the relevant upper switch is higher than a voltage at the upper DC voltage terminal, and each lower switch being closed only as long as a phase voltage at the relevant lower switch is lower than a voltage at the lower DC voltage terminal; phase branch currents being measured in all the lower branches.

11 Claims, 2 Drawing Sheets

(51) Int. Cl.
    *H02P 25/22* (2006.01)
    *H02P 23/14* (2006.01)
    *B60L 7/18* (2006.01)
    *G01R 31/00* (2006.01)
    *H02M 1/00* (2006.01)
    *H02M 7/219* (2006.01)

(52) U.S. Cl.
    CPC .............. *H02P 23/14* (2013.01); *H02P 25/22* (2013.01); *H02M 2001/0009* (2013.01); *H02M 2007/2195* (2013.01); *Y02B 70/1408* (2013.01)

(56) References Cited

U.S. PATENT DOCUMENTS

2008/0042606 A1* 2/2008 Chen ..................... B60L 15/025
                                                                                                  318/474
2011/0241697 A1* 10/2011 Omatsu .............. G01R 31/1227
                                                                                                  324/551

FOREIGN PATENT DOCUMENTS

| DE | 102012217116 A1 | 3/2014 |
| EP | 2360483 A1 | 8/2011 |
| WO | 2014044526 A2 | 3/2014 |

* cited by examiner

METHOD FOR DETERMINING THE PHASE CURRENTS OF AN ELECTRIC MACHINE HAVING A CONVERTER

FIELD

The present invention relates to a method for determining the phase currents of an electric machine having a power converter, and to a computation unit and a computer program for carrying it out.

BACKGROUND INFORMATION

Conventional generators convert mechanical energy into electrical energy. Claw pole generators are generally used in motor vehicles, and can be equipped with electrical excitation. Because claw pole generators generate three-phase current, rectification is necessary for the DC voltage vehicle electrical systems common in motor vehicles. Rectifiers having semiconductor diodes and/or active switching elements can be used for this.

Generators that can also be used to drive a vehicle (i.e., can also be operated in motor mode) are used in the field of hybrid vehicles. The objective here is to assist the combustion engine at low rotation speeds at which it is not yet supplying its full torque (boost mode, turbo lag compensation). In addition, thanks to active electric braking (generator mode), the vehicle's kinetic energy can be fed back into the vehicle's electrical system (regeneration). For generator mode, the power converter can be operated as an active rectifier in which the high-side and low-side switches are switched over as a function of phase voltage. For example, the low-side switches are closed when the phase voltage is negative, and the high-side switches when the phase voltage is higher than the battery voltage. A knowledge of the phase currents is important for accurate control of the active braking torque.

The phase currents can be measured via measuring resistors, called "shunts." As a rule these shunts are installed not directly in the phases of the drive system but instead in a low-side branch of the power converter. An individual-phase current measurement using low-side shunts is available in the field of control application to electric motors. In this context, however, as indicated in German Patent Application No.s DE 103 27 690 B4 or DE 10 2012 217 116 A1, the current measurement must be synchronized with the control application. This is relatively complex. Also problematic in the context of active rectification is the fact that at no point in time are all the low-side switches closed. With current measurements in the low-side branch, however, currents not equal to zero can also be measured when a switch is open, for example due to measurement noise, sensor offsets, etc. This makes evaluation even more difficult.

It is therefore desirable to describe a method with which all the phase currents can be determined in as simple a manner as possible even in an active rectification mode.

SUMMARY

The present invention provides a method for determining the phase currents of an electric machine having a power converter, as well as a computation unit and a computer program for carrying it out, having the features of the independent claims. Advantageous embodiments are described herein.

In the context of the present invention, a possibility is provided for determining all the phase currents of an electric machine having a number of phases by substantially simultaneous measurement of all low-side-branch currents and correlation of the measured values. At least two, and fewer than the number of phases, of all the measured low-side-branch currents are then utilized for calculation of the phase currents. Preferably the phases to be utilized are selected on the basis of the measured value; in particular, the two measured low-side-branch currents having the greatest amplitude in absolute terms are utilized for calculation of the phase currents. As a result, the present switching state in the individual branches is immaterial. "Incorrect" low-side-branch currents, which are measured as a result of noise, sensor offsets, etc. even though the associated low-side switch is closed, are always lower in terms of absolute value than "correct" low-side-branch currents that flow through the open low-side switch. For the same reason, synchronization of the measurement with the switching sequence is also no longer necessary. Instead, the measurement of all the low-side-branch currents can take place at any points in time and independently of switching times of the active rectification mode. Usefully, all the low-side-branch currents are measured substantially simultaneously. This can be accomplished in particular using a corresponding number of parallel A/D conversions or, for example, using a multiplexer and serial A/D conversions, provided those serial A/D conversions are carried out so quickly that during them, no significant change in the phase current is to be expected. Usefully, the low-side-branch currents are measured in a regular time pattern.

The present invention is suitable for all multi-phase machines having at least four phases. The phase currents can always be calculated from a suitable number (at least two and at most N−1, where N is the number of phases) of low-side-branch currents, since the angular distances between the phases are known for each machine. A particularly suitable selection is that of the two low-side-branch currents having the greatest absolute value. This is discussed in further detail below using the example of a five-phase machine. The invention provides particular advantages for machines having more than four phases, since here the number of calculated phase currents is always equal to or greater than the number of low-side-branch currents (two) having the greatest absolute value, i.e., all invalid values can be calculated from only two valid measured values.

The present invention is particularly advantageously suitable for use in hybrid or regenerative drive technologies, since here a knowledge of all the phase currents allows an accurate adjustment of active braking torque.

A computation unit according to the present invention, for example a control unit of a motor vehicle, is configured, in particular in terms of program execution, to carry out a method according to the present invention.

Implementation of the method in the form of software is also advantageous, since this entails particularly low costs, especially if an executing control device is also used for further tasks and is therefore present in any case. Suitable data media for furnishing the computer program are, in particular, diskettes, hard drives, flash memories, EEPROMs, CD-ROMs, DVDs, and many others. Downloading of a program via computer networks (Internet, intranet, etc.) is also possible.

Further advantages and embodiments of the invention are evident from the description herein and the figures.

It is understood that the features recited above and those yet to be explained below are usable not only in the respective combination indicated but also in other combinations or in isolation, without departing from the scope of the present invention.

The present invention is schematically depicted in the figures on the basis of (an) exemplifying embodiment(s), and will be described in detail below with reference to the figures.

DETAILED DESCRIPTION OF EXAMPLE EMBODIMENTS

Figure 1:
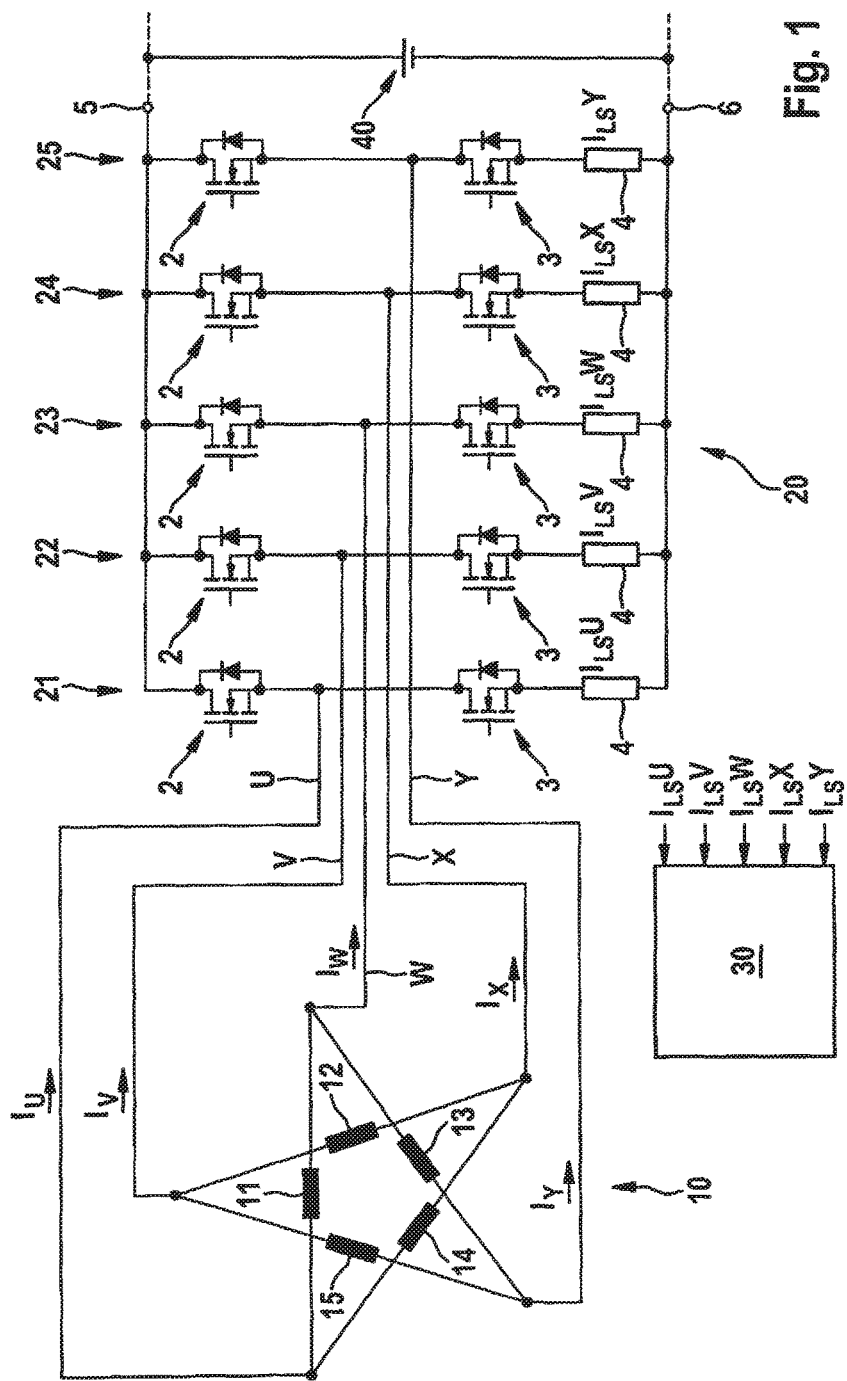
FIG. 1 schematically depicts an electric machine having a power converter, which can be the basis of the invention.

FIG. 1 is a highly simplified depiction of those elements of an electric machine having a power converter which are essential to an illustration of the invention, said machine being capable of being part of a vehicle electrical system. A five-phase stator 10 is encompassed thereby. Five-phase stator 10 has a total of five stator winding strands (also called "stator windings") 11 to 15. For the sake of clarity, a rotor is not depicted.

Five-phase stator 10 is connected with its five stator winding strands 11 to 15 to a power converter 2 that has five power converter bridges 21 to 25 having active switching elements 2, 3, for example MOSFETs, as switches. The five stator winding strands 11 to 15 and the five power converter bridges 21 to 25 respectively define the five phases U to Y of the electric machine. Power converter 2 can be operated as a rectifier (usually when the electric machine is operating in a generator mode to power the vehicle electrical system) or as an inverter (usually when the electric machine is operating in a motor mode).

Active switching elements 2, 3 are connected via busbars on the one hand to stator winding strands 11 to 15 and on the other hand to DC voltage terminals 5, 6. DC voltage terminals 5, 6 can be connected to an electrical energy reservoir in a vehicle electrical system, for example a battery 40. Upper DC voltage terminal 5 is connected to the positive battery terminal, and lower DC voltage terminal 6 to the negative battery terminal or to ground. Active switching elements 2 are thus disposed in the so-called "upper" rectifier branch, and active switching elements 3 in the lower rectifier branch. Active switching elements 2 are thus so-called "high-side" switching elements constituting upper switches, and active switching elements 3 are so-called "low-side" switching elements constituting lower switches. The terms "high-side branch" (from the center point of the respective power converter bridges 21 to 25 via switching elements 2 to DC voltage terminal 5) and "low-side branch" (from the center point of the respective power converter bridges 21 to 25 via switching elements 3 to DC voltage terminal 6) are also used.

A current measurement occurs via measuring resistors (shunts) 4 in the low-side branches of power converter 20. As is known, the voltage drop at the measuring resistor is measured for this purpose, here in particular at an analog/digital converter input of a control device 30.

A method for determining all the phase currents in accordance with an advantageous embodiment of the invention is described with reference to FIG. 2. Control device 30 is configured in terms of program execution to carry out the method.

Figure 2:
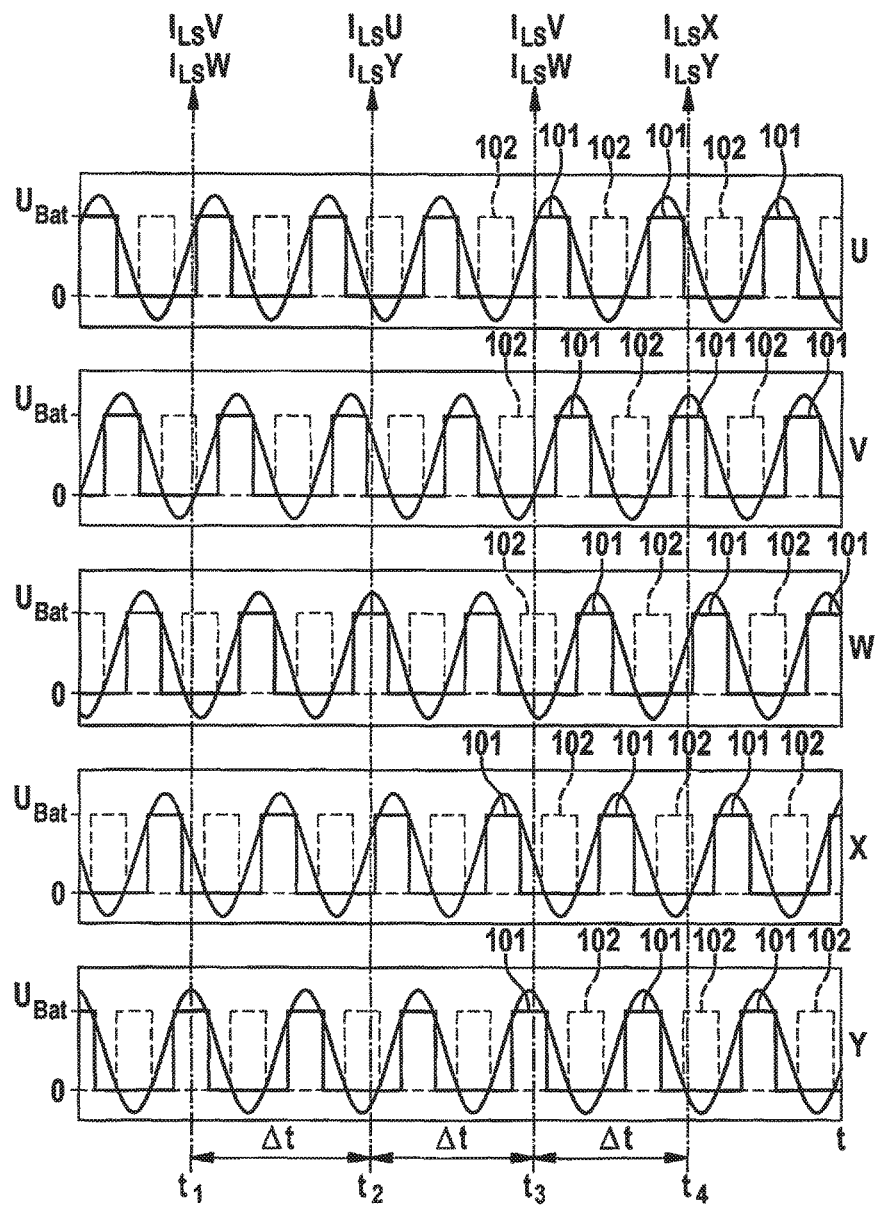
FIG. 2 schematically depicts a control application diagram for active rectification of an electric machine having a power converter as shown in FIG. 1.

FIG. 2 depicts, one above another, the time courses of the phase voltages of the five phases U, V, W, X, and Y. A battery voltage of a battery connected between upper DC voltage terminal 5 and lower DC voltage terminal 6 is labeled $U_{Bat}$, and ground is labeled "0". In a typical hybrid drive system, power converter 20 is connected to a high-voltage vehicle electric system, for example 48 V.

In the active rectification mode, each of high-side switching elements 2 is closed as long as the associated phase voltage with respect to ground is higher than the battery voltage (with respect to ground) present at upper DC voltage terminal 5. The respective switching pattern is labeled 101.

Also in accordance with the active rectification mode, each of low-side switching elements 3 is closed as long as the associated phase voltage with respect to ground is lower than the ground present at lower DC voltage terminal 5. The respective switching pattern is labeled 102.

In the context of the present invention, it is now possible to determine all the phase currents $I_U$, $I_V$, $I_W$, $I_X$, $I_Y$ by appropriate simultaneous measurement of all the low-side-branch currents $I_{LS}U$, $I_{LS}V$, $I_{LS}W$, $I_{LS}X$, $I_{LS}Y$. Of all the measured low-side-branch currents, the two having the largest amplitude in terms of absolute value are then utilized for calculation of the phase currents. These are labeled "valid" in FIG. 2, and the other three "invalid." Examples of measurement times are identified by vertical dashed lines. The measurements can be located, in particular, arbitrarily and independently of switching times of the active rectification mode. In the present example the measurement times are equidistant at a regular time interval $\Delta t$.

From a knowledge of the angular distances between the phases (here 72°), each phase current can be calculated as a function of the low-side-branch currents that have the largest absolute values, i.e. are valid. The following conversion factors are defined for this purpose:

$$\text{Factor } 11 = \sin(216°)/\sin(288°)$$

$$\text{Factor } 21 = \cos(216°) - (\sin(216°)/\tan(288°))$$

$$\text{Factor } 12 = \sin(144°)/\sin(216°)$$

$$\text{Factor } 22 = \cos(144°) - (\sin(144°)/\tan(216°))$$

$$\text{Factor } 13 = \sin(72°)/\sin(144°)$$

$$\text{Factor } 23 = \cos(72°) - (\sin(72°)/\tan(144°))$$

In the present example, at a measurement time $t_1$ the low-side-branch currents $I_{LS}V$ and $I_{LS}W$ are therefore valid and are thus simultaneously the respective phase currents $I_V$ and $I_W$. The other phase currents are obtained therefrom as:

$$I_X = (I_{LS}V - I_{LS}W * \text{Factor } 11)/\text{Factor } 21$$

$$I_Y = (I_{LS}V - I_{LS}W * \text{Factor } 12)/\text{Factor } 22$$

$$I_U = (I_{LS}V - I_{LS}W * \text{Factor } 13)/\text{Factor } 23$$

At a measurement time $t_2$ the low-side-branch currents $I_{LS}U$ and $I_{LS}Y$ are valid and are thus simultaneously the respective phase currents $I_U$ and $I_Y$. The other phase currents are obtained therefrom as:

$$I_V = (I_{LS}Y - I_{LS}U * \text{Factor } 11)/\text{Factor } 21$$

$$I_W = (I_{LS}Y - I_{LS}U * \text{Factor } 12)/\text{Factor } 22$$

$$I_X = (I_{LS}Y - I_{LS}U * \text{Factor } 13)/\text{Factor } 23$$

At a measurement time $t_4$ the low-side-branch currents $I_{LS}X$ and $I_{LS}Y$ are valid and are thus simultaneously the respective phase currents $I_X$ and $I_Y$. The other phase currents are obtained therefrom as:

$$I_U = (I_{LS}X - I_{LS}Y * \text{Factor } 11)/\text{Factor } 21$$

$$I_V = (I_{LS}X - I_{LS}Y * \text{Factor } 12)/\text{Factor } 22$$

$$I_W = (I_{LS}X - I_{LS}Y * \text{Factor } 13)/\text{Factor } 23$$

For valid low-side-branch currents $I_{LS}U$ and $I_{LS}V$, the other phase currents are obtained as:

$$I_W = (I_{LS}U - I_{LS}V * \text{Factor } 11)/\text{Factor } 21$$

$$I_X = (I_{LS}U - I_{LS}V * \text{Factor } 12)/\text{Factor } 22$$

$$I_Y = (I_{LS}U - I_{LS}V * \text{Factor } 13)/\text{Factor } 23$$

Lastly, for valid low-side-branch currents $I_{LS}W$ and $I_{LS}X$, the other phase currents are obtained as:

$$I_Y = (I_{LS}W - I_{LS}X * \text{Factor } 11)/\text{Factor } 21$$

$$I_U = (I_{LS}W - I_{LS}X * \text{Factor } 12)/\text{Factor } 22$$

$$I_V = (I_{LS}W - I_{LS}X * \text{Factor } 13)/\text{Factor } 23$$

All in all, it is thus possible by way of the present invention to determine all the phase currents of an electric machine having at least four phases even when the power converter is being operated as an active rectifier.

What is claimed is:

1. A method for determining phase currents of an electric machine, the electric machine including a power converter and a stator having at least four phases, the power converter having, for each of the at least four phases, an upper branch having an upper switch and a lower branch having a lower switch, all the upper branches being connected to an upper DC voltage terminal and all the lower branches to a lower DC voltage terminal, the method comprising:
   operating the power converter in an active rectification mode in which each upper switch is closed only as long as a phase voltage with respect to ground at the relevant upper switch is higher than a voltage with respect to ground at the upper DC voltage terminal, and each lower switch being closed only as long as a phase voltage with respect to ground at the relevant lower switch is lower than a voltage with respect to ground at the lower DC voltage terminal;
   while the power converter is operating in the active rectification mode, measuring in each lower branch of the lower branches, a respective low-side phase branch current in the lower branch, to provide a respective measured phase current for each of the lower branches, the measuring and the providing being for all of the lower branches;
   determining for each phase of the at least four phases, via a processor, a respective phase current of the phase, wherein the determined respective phase currents of the at least four phases are determined from only two of the respective measured phase branch currents having the greatest absolute values, wherein the processor is coupled to power converter and is configured to receive the respective measured phase branch currents at an input, the processor having a non-transitory machine readable storage medium storing program code for performing at least the determining step; and
   controlling an active braking torque during a generator mode of the electric machine using the determined respective phase currents.

2. The method as recited in claim 1, wherein the respective low-side phase branch currents are measured in all the lower branches simultaneously.

3. The method as recited in claim 1, wherein the respective low-side phase branch currents are measured in all the lower branches by way of a respective measuring resistor in each of the lower branches.

4. The method as recited in claim 1, wherein the respective low-side phase branch currents are measured in all the lower branches in a regular time pattern.

5. The method as recited in claim 1, wherein the respective low-side phase branch currents are measured in all the lower branches independently of switching times of the active rectification mode.

6. The method as recited in claim 1, wherein the determined phase currents are determined based on angular distances between the at least four phases.

7. The method as recited in claim 1, wherein a battery voltage is applied between the upper DC voltage terminal and the lower DC voltage terminal.

8. A computation unit for determining phase currents of an electric machine, the electric machine including a power converter and a stator having at least four phases, the power converter having, for each of the at least four phases, an upper branch having an upper switch and a lower branch having a lower switch, all the upper branches being connected to an upper DC voltage terminal and all the lower branches to a lower DC voltage terminal, comprising:
   a computation device having program code stored on a non-transitory computer, which is executable by a processor, for performing the following:
   operating the power converter in an active rectification mode in which each upper switch is closed only as long as a phase voltage with respect to ground at the relevant upper switch is higher than a voltage with respect to ground at the upper DC voltage terminal, and each lower switch being closed only as long as a phase voltage with respect to ground at the relevant lower switch is lower than a voltage with respect to ground at the lower DC voltage terminal;
   while the power converter is operating in the active rectification mode, measuring in each lower branch of the lower branches, a respective low-side phase branch current in the lower branch, to provide a respective measured phase current for each of the lower branches, the measuring and providing being for all of the lower branches;
   determining for each phase of the at least four phases a respective phase current of the phase, wherein the determined respective phase currents of the at least four phases are determined from only two of the respective measured phase branch currents having the greatest absolute values; and
   controlling an active braking torque during a generator mode of the electric machine using the determined respective phase currents;
   wherein the processor is coupled to the power converter and is configured to receive and is configured to receive the respective measured phase branch currents at an input.

9. A motor vehicle electrical system, comprising:
   an electric machine having a power converter and a stator having at least four phases, the power converter having, for each of the at least four phases, an upper branch having an upper switch and a lower branch having a lower switch, all the upper branches being connected to an upper DC voltage terminal and all the lower branches to a lower DC voltage terminal; and a computation unit for determining phase currents of the electric machine, the computation unit having a non-transitory machine readable storage medium storing program code, the program code, when executed by the computation unit, causing the computation unit to perform the following:

while the power converter is operating in the active rectification mode, operating the power converter in an active rectification mode in which each upper switch is closed only as long as a phase voltage with respect to ground at the relevant upper switch is higher than a voltage with respect to ground at the upper DC voltage terminal, and each lower switch being closed only as long as a phase voltage with respect to ground at the relevant lower switch is lower than a voltage with respect to ground at the lower DC voltage terminal;

while the power converter is operating in the active rectification mode, measuring in each lower branch of the lower branches, a respective low-side phase branch current in the lower branch, to provide a respective measured phase current for each of the lower branches, the measuring and providing being for all of the lower branches;

determining for each phase of the at least four phases a respective phase current of the phase, wherein the determined respective phase currents of the at least four phases are determined from only two of the respective measured phase branch currents having the greatest absolute values; and controlling an active braking torque during a generator mode of the electric machine using the determined respective phase currents;

wherein the computation unit is coupled to the power converter and is configured to receive and is configured to receive the respective measured phase branch currents at an input.

10. The motor vehicle electrical system as recited in claim 9, further comprising:

an electrical energy reservoir that is connected between the upper DC voltage terminal and the lower DC voltage terminal.

11. A non-transitory machine-readable storage medium on which is stored a computer program, which is executable by a processor, comprising:

a program code arrangement having program code for determining phase currents of an electric machine, the electric machine including a power converter and a stator having at least four phases, the power converter having, for each of the at least four phases, an upper branch having an upper switch and a lower branch having a lower switch, all the upper branches being connected to an upper DC voltage terminal and all the lower branches to a lower DC voltage terminal, the computer program, when executed by a computation unit, by performing the following:

operating the power converter in an active rectification mode in which each upper switch is closed only as long as a phase voltage with respect to ground at the relevant upper switch is higher than a voltage with respect to ground at the upper DC voltage terminal, and each lower switch being closed only as long as a phase voltage with respect to ground at the relevant lower switch is lower than a voltage with respect to ground at the lower DC voltage terminal;

while the power converter is operating in the active rectification mode, measuring, in each lower branch of the lower branches, a respective low-side phase branch current in the lower branch, to provide a respective measured phase current for each of the lower branches, the measuring and providing being for all of the lower branches;

determining for each phase of the at least four phases a respective phase current of the phase, wherein the determined respective phase currents of the at least four phases are determined from only two of the respective measured phase branch currents having the greatest absolute values; and controlling an active braking torque during a generator mode of the electric machine using the determined respective phase currents;

wherein the computation unit is coupled to the power converter is configured to receive the respective measured phase branch currents at an input.

* * * * *